(12) United States Patent
Zhang et al.

(10) Patent No.: US 10,985,320 B2
(45) Date of Patent: Apr. 20, 2021

(54) ORGANIC TRANSISTOR AND MANUFACTURING METHOD THEREOF, ARRAY SUBSTRATE, DISPLAY DEVICE

(71) Applicants: HEFEI BOE DISPLAY TECHNOLOGY CO., LTD., Anhui (CN); BOE TECHNOLOGY GROUP CO., LTD., Beijing (CN)

(72) Inventors: Ji Zhang, Beijing (CN); Weiwei Hu, Beijing (CN); Liang Chen, Beijing (CN); Jincheng Gao, Beijing (CN); Guanbao Hui, Beijing (CN)

(73) Assignees: HEFEI BOE DISPLAY TECHNOLOGY CO., LTD., Anhui (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 16/484,150

(22) PCT Filed: Dec. 26, 2018

(86) PCT No.: PCT/CN2018/123898
§ 371 (c)(1),
(2) Date: Aug. 7, 2019

(87) PCT Pub. No.: WO2019/134568
PCT Pub. Date: Jul. 11, 2019

(65) Prior Publication Data
US 2020/0006662 A1    Jan. 2, 2020

(30) Foreign Application Priority Data
Jan. 5, 2018   (CN) .......................... 201810012058.6

(51) Int. Cl.
*H01L 51/00* (2006.01)
*G03F 7/16* (2006.01)
(Continued)

(52) U.S. Cl.
CPC ........ *H01L 51/0028* (2013.01); *H01L 51/004* (2013.01); *H01L 51/0007* (2013.01);
(Continued)

(58) Field of Classification Search
CPC ............. H01L 51/0012; H01L 51/0002; H01L 51/0558; H01L 51/0545; H01L 51/004;
(Continued)

(56) References Cited

U.S. PATENT DOCUMENTS 9,112,161 B2 * 8/2015 Yang .................. H01L 51/0533
2009/0136877 A1 * 5/2009 Suganuma .......... H01L 51/0016
430/325

(Continued)

FOREIGN PATENT DOCUMENTS

CN    101931052 A    12/2010
CN    103907178 A    7/2014
(Continued)

OTHER PUBLICATIONS

First Office Action for Chinese Patent Application No. 201810012058.6 dated Mar. 26, 2019.

(Continued)

*Primary Examiner* — Michael M Trinh
(74) *Attorney, Agent, or Firm* — Calfee, Halter & Calfee, LLP

(57) ABSTRACT

The present disclosure provides an organic transistor and a manufacturing method thereof, an array substrate, and a display device. The method for manufacturing the organic transistor includes: applying a photoresist on a side of an organic insulating layer; patterning the photoresist to form a confinement well; adding a solution of an organic semiconductor material and an orthogonal solvent to the confinement well; volatilizing the orthogonal solvent by an annealing process to induce directional growth of single crystal of the (Continued)

organic semiconductor material in the confinement well, thereby obtaining an organic single crystal layer; and removing remaining photoresist and using the organic single crystal layer as an active layer. The embodiment of the present disclosure produces an organic single crystal in a flexible display device at a low temperature, and the organic single crystal can be used as an active layer, resulting in an organic transistor having high mobility and stability.

10 Claims, 7 Drawing Sheets

(51) Int. Cl.
  *G03F 7/20* (2006.01)
  *H01L 51/05* (2006.01)
(52) U.S. Cl.
  CPC .................. *G03F 7/16* (2013.01); *G03F 7/20* (2013.01); *H01L 51/0074* (2013.01); *H01L 51/0094* (2013.01); *H01L 51/0558* (2013.01)
(58) Field of Classification Search
  CPC ..... H01L 51/0007; G03F 7/40; G03F 7/0752; G03F 7/0007; G03F 7/16
  See application file for complete search history.

(56) References Cited

U.S. PATENT DOCUMENTS

| | | | | |
|---|---|---|---|---|
| 2014/0312335 | A1* | 10/2014 | Goto | H01L 51/0558 257/40 |
| 2016/0380201 | A1* | 12/2016 | Li | G03F 7/32 257/40 |
| 2020/0006662 | A1 | 1/2020 | Zhang et al. | |

FOREIGN PATENT DOCUMENTS

| | | |
|---|---|---|
| CN | 106159091 A | 11/2016 |
| CN | 108183165 A | 6/2018 |

OTHER PUBLICATIONS

Second Office Action for Chinese Patent Application No. 201810012058.6 dated Aug. 7, 2019.

Third Office Action for Chinese Patent Application No. 201810012058.6 dated Dec. 17, 2019.

Do Hwan Kim et al., "High-Mobility Organic Transistors Based on SIngle-Crystalline Microribbons of Triisopropylsilylethynyl Pentacene via Solution-Phase Self-Assembly", Advanced Materials 2007,19, 678-682.

* cited by examiner

ORGANIC TRANSISTOR AND MANUFACTURING METHOD THEREOF, ARRAY SUBSTRATE, DISPLAY DEVICE

RELATED APPLICATIONS

The present application is a 35 U.S.C. 371 national stage application of PCT International Application No. PCT/CN2018/123898, filed on Dec. 26, 2018, which claims the benefit of Chinese Patent Application No. 201810012058.6, filed on Jan. 5, 2018, the entire disclosures of which are incorporated herein by reference.

TECHNICAL FIELD

The present disclosure relates to the field of display technology, and particularly to an organic transistor and a manufacturing method thereof, an array substrate, and a display device.

BACKGROUND

In the field of conventional flat panel display, the glass substrate is a basic material. However, ultra-thin glass is fragile and costly, thus it is difficult to manufacture large-sized flexible displays with the ultra-thin glass. The use of organic flexible substrates is a good alternative solution.

However, organic substrates are typically unable to withstand high temperatures (>200° C.), which makes silicon-based plasma enhanced chemical vapor deposition (PECVD, with a temperature range close to 300° C.) cannot be carried out on organic substrates, so it is difficult to obtain a high quality film of a-Si, LTPS or SiNx on an organic substrate. In addition, for an oxide semiconductor material typified by an amorphous oxide semiconductor (e.g., IGZO: In—Ga—Zn—O), although a magnetron sputtering process does not require a high temperature, an indispensable annealing process with a high temperature of 300° C. or higher is still required to obtain a high quality film.

In order to achieve a fully flexible display, get functional devices such as e-paper, electronic skin and printable displays, the traditional silicon-based process should be abandoned, and devices may be built with flexible organic materials realized by low-temperature deposition. At present, it is not so difficult to use organic materials to make organic insulating layers and encapsulating layers. The core problem lies in the construction of semiconductor layers. Although traditional organic thin film transistors have been studied for more than 30 years (first reported in 1986), low mobility and unstable threshold voltages are still difficult to overcome. Organic single crystals have become an alternative. Although the preparation of single crystals is complicated, it is not impossible to obtain single crystals by controlling the process conditions. Moreover, the single crystal inherently has little carrier traps and lattice defects, so that the performance of the single crystal-constructed TFT device is much better.

Organic thin film transistors have been used to achieve high resolution electronic paper with good results. However, since the product is made of an organic polymer semiconductor, the semiconductor has a low mobility and the response time is too long, so it can only be used for electronic paper reading. Currently, there are no products related to organic single crystals. Although some proposals have been made for the preparation of single crystals, the actual production efficiency is still low, which cannot satisfy the mass production.

SUMMARY

In the first aspect of the present disclosure, a method for manufacturing an organic single crystal layer is provided. The method includes: adding a solution of an organic semiconductor material and an orthogonal solvent to a confinement well; and volatilizing the orthogonal solvent by an annealing process to induce directional growth of single crystal of the organic semiconductor material in the confinement well, thereby obtaining an organic single crystal layer.

Optionally, the organic semiconductor material is 2,7-diocty[1]benzothieno[3,2-b]benzothiophene.

In the second aspect of the present disclosure, a method for manufacturing an organic transistor is provided. The method includes: applying a photoresist on a side of an organic insulating layer; patterning the photoresist to form a confinement well; adding a solution of an organic semiconductor material and an orthogonal solvent to the confinement well; volatilizing the orthogonal solvent by an annealing process to induce directional growth of single crystal of the organic semiconductor material in the confinement well, thereby obtaining an organic single crystal layer; and removing remaining photoresist and using the organic single crystal layer as an active layer.

Optionally, before applying the photoresist on the side of the organic insulating layer, the method further includes: forming an organic polymer layer on a surface of the organic insulating layer.

Optionally, the step of forming the organic polymer layer on the surface of the organic insulating layer includes: performing a hydrophilic treatment and a hydrophobic treatment to a surface of the organic polymer layer in sequence.

Optionally, after the step of patterning the photoresist to form the confinement well and before the step of adding the solution of the organic semiconductor material and the orthogonal solvent to the confinement well, the method further includes: performing a hydrophilic treatment to a surface of the organic polymer layer not covered by the photoresist; the solution of the organic semiconductor material being hydrophilic.

Optionally, after the step of patterning the photoresist to form the confinement well and before the step of adding the solution of the organic semiconductor material and the orthogonal solvent to the confinement well, the method further includes: performing a hydrophilic treatment and a hydrophobic treatment to a surface of the organic polymer layer not covered by the photoresist in sequence; the solution of the organic semiconductor material being hydrophobic.

Optionally, the step of forming the organic polymer layer on the surface of the organic insulating layer includes: preparing the organic polymer layer on the surface of the organic insulating layer using a polysiloxane-based organic polymer.

Optionally, the organic insulating layer is prepared using one or more of polyacrylonitrile, polypropylene oxide, and polymethyl methacrylate.

In the third aspect of the present disclosure, an organic transistor is provided. The organic transistor includes: an organic insulating layer and an organic single crystal layer on the organic insulating layer; the organic single crystal layer is used as an active layer; and the organic single crystal layer is manufactured by the method according to any one of the above-mentioned embodiments.

Optionally, the organic transistor further includes: an organic polymer layer disposed between the organic single crystal layer and the organic insulating layer.

Optionally, a material of the organic polymer layer is a polysiloxane-based organic polymer.

Optionally, a material of the organic insulating layer includes one or more of polyacrylonitrile, polypropylene oxide, and polymethyl methacrylate.

In the fourth aspect of the present disclosure, an array substrate is provided. The array substrate includes the organic transistor according to any one of the above-mentioned embodiments.

In the fifth aspect of the present disclosure, a display device is provided. The display device includes the array substrate according to the above-mentioned embodiment.

BRIEF DESCRIPTION OF THE DRAWINGS

In order to more clearly illustrate the technical solutions in embodiments of the disclosure or in the prior art, the appended drawings needed to be used in the description of the embodiments or the prior art will be introduced briefly in the following. Obviously, the drawings in the following description are only some embodiments of the disclosure, and for those of ordinary skills in the art, other drawings may be obtained according to these drawings under the premise of not paying out creative work.

DETAILED DESCRIPTION OF THE DISCLOSURE

In order to make the objects, technical solutions and advantages of the present disclosure more clear, the present disclosure will be further described in detail below with reference to the specific embodiments thereof and the accompanying drawings.

It should be noted that all the expressions using "first" and "second" in the embodiments of the present disclosure are used to distinguish two features that are not the same or non-identical parameters. The wording of "first" or "second" is used for the convenience of the description, it should not be construed as limiting the embodiments of the present disclosure, and this principle will not be described again in the subsequent embodiments.

The present disclosure provides an organic transistor, an array substrate, a display device, and related manufacturing methods. With the embodiments of the present disclosure, an efficient and reliable method for manufacturing an organic single crystal layer is provided. The embodiment of the present disclosure also produces an organic single crystal in a flexible display device at a low temperature, and the organic single crystal can be used as an active layer, resulting in an organic transistor having high mobility and stability.

The present disclosure is directed to the problem that the mobility and stability of the current semiconductor layer structure are not high, and a design using an organic single crystal as an active layer is proposed. In addition, an improved method for preparing an organic single crystal layer is proposed due to the lack of a corresponding process for preparing an organic single crystal layer, especially for preparing an organic single crystal in a flexible display related device. In this way, the manufacture of the organic single crystal layer can be realized efficiently and stably, and the organic single crystal layer can be applied to an organic transistor, thereby obtaining a flexible display device with an improved display effect. Therefore, the present disclosure first improves the manufacture of an organic single crystal layer. At present, the active layer is usually prepared by vacuum evaporation or coating, forming an amorphous film. The performance of the resulted active layer is not as good as that of the single crystal. Therefore, it is necessary to consider how to form a directionally grown single crystal layer.

Figure 1:
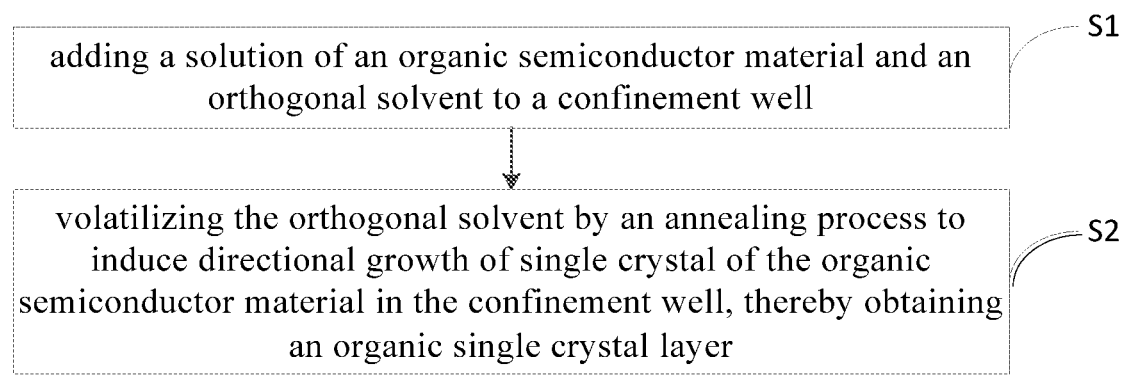
FIG. 1 is a flow chart of a method for manufacturing an organic single crystal layer according to an embodiment of the present disclosure.

In view of the growth characteristics of single crystal, the present embodiment provides a method for manufacturing an organic single crystal layer by using an orthogonal solvent. FIG. 1 is a flow chart of a method for manufacturing an organic single crystal layer according to an embodiment of the present disclosure. The method for manufacturing the organic single crystal layer includes the following steps.

Step S1, adding a solution of an organic semiconductor material and an orthogonal solvent to a confinement well. For example, the confinement well may be a trench structure having a predetermined shape, so that an organic single crystal with a predetermined shape can be formed in the confinement well, thereby obtaining an organic single crystal layer having a desired shape. The solution of the organic semiconductor material is a material for preparing the organic single crystal, and is prepared based on the desired single crystal. The orthogonal solvent is a solvent that does not dissolve the organic semiconductor material, so that the organic single crystal is rapidly precipitated from the solution of the organic semiconductor material, thereby improving the preparation efficiency. In some embodiments, the material used to prepare the organic single crystal layer may be an alkyl-substituted benzothiophene compound such as 2,7-diocty[1]benzothieno[3,2-b]benzothiophene (C8-BTBT). 2,7-diocty[1]benzothieno[3,2-b]benzothiophene can be dissolved in, for example, toluene to form the solution of the organic semiconductor material.

Step S2, volatilizing the orthogonal solvent by an annealing process to induce directional growth of single crystal of the organic semiconductor material in the confinement well, thereby obtaining an organic single crystal layer. By volatilizing the orthogonal solvent, only the organic single crystal layer remains in the confinement well, thereby obtaining a high quality organic single crystal layer.

It can be seen from the above embodiments that the present disclosure utilizes an orthogonal solvent to prepare an organic single crystal layer, which can not only prepare a structure of directionally grown organic single crystal layer, but also greatly improve the preparation efficiency of the organic single crystal layer.

The organic single crystal layer in the above embodiment can be used as an active layer in an organic transistor, thereby obtaining an organic transistor having high mobility and more stable performance.

Figure 2:
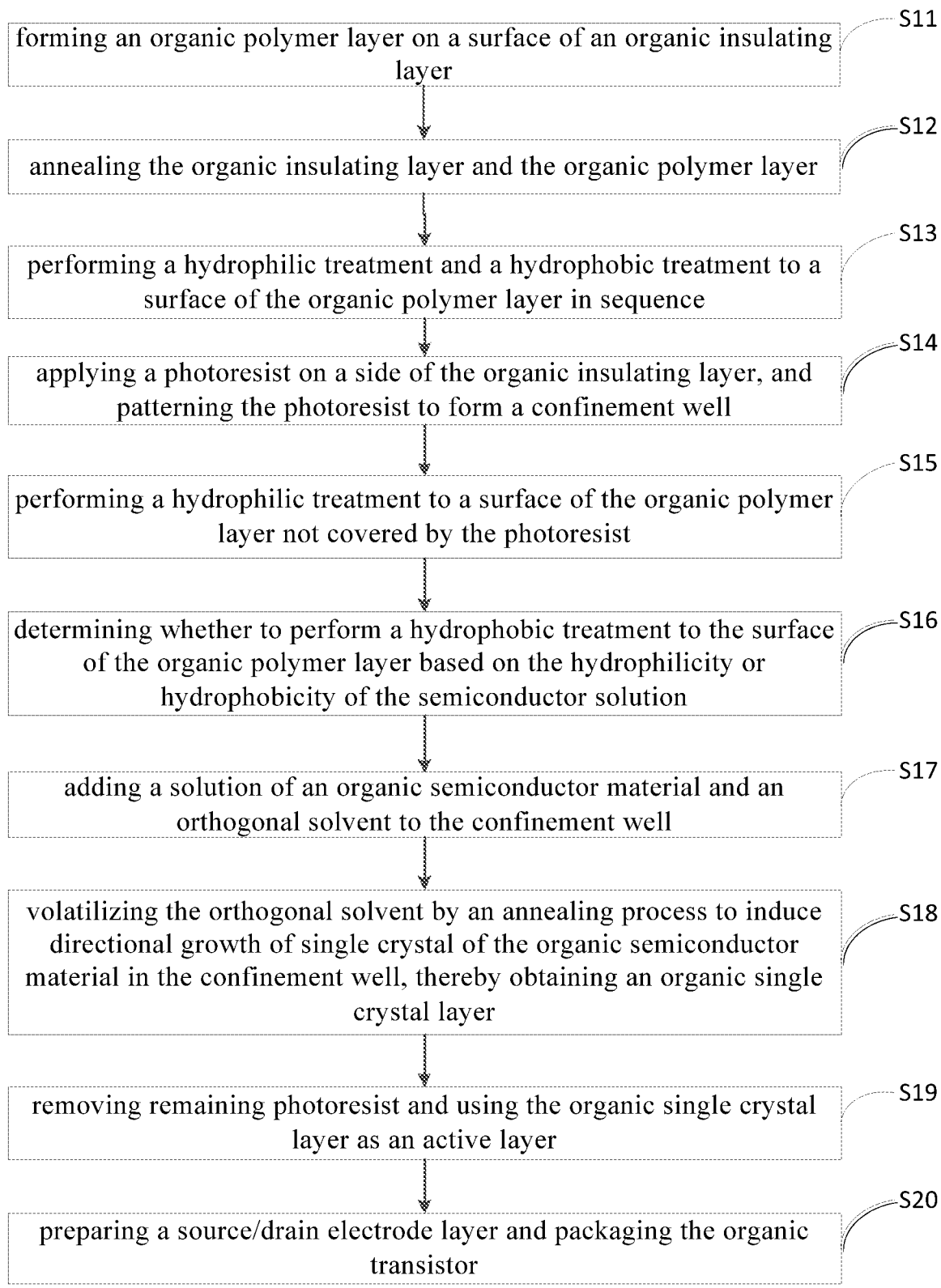
FIG. 2 is a flow chart of a method for manufacturing an organic transistor according to an embodiment of the present disclosure.

The present disclosure further proposes a method for manufacturing a transistor in which an organic single crystal is employed as an active layer. FIG. 2 is a flow chart of a method for manufacturing an organic transistor according to an embodiment of the present disclosure. The method of manufacturing the organic transistor includes the following steps.

Step S11, forming an organic polymer layer on a surface of an organic insulating layer. In order to prepare an organic single crystal in an organic transistor and use the organic single crystal as an active layer, the orthogonal solvent is used in the above embodiment. Typically, the organic insulating layer is in contact with the active layer, thus the orthogonal solvent will destroy the organic insulating layer. For this case, the present disclosure proposes to prepare an organic polymer layer on the organic insulating layer to prevent the organic insulating layer from being destroyed by the orthogonal solvent, thereby protecting the organic insulating layer from damage. The material of the organic insulating layer may be one or a combination of polyacrylonitrile (PAN), polypropylene oxide (PPO), and polymethyl methacrylate (PMMA). The material of the organic polymer layer may be a polysiloxane-based organic polymer. Optionally, the material of the organic polymer layer is polymethylsilsesquioxane (PMSQ). It should be noted that the step of forming the organic polymer layer on the surface of the organic insulating layer is optional, and a photoresist may be directly formed on the organic insulating layer based on the resistance of the organic insulating layer to the orthogonal solvent, without preparing the organic polymer layer.

Figure 3A:
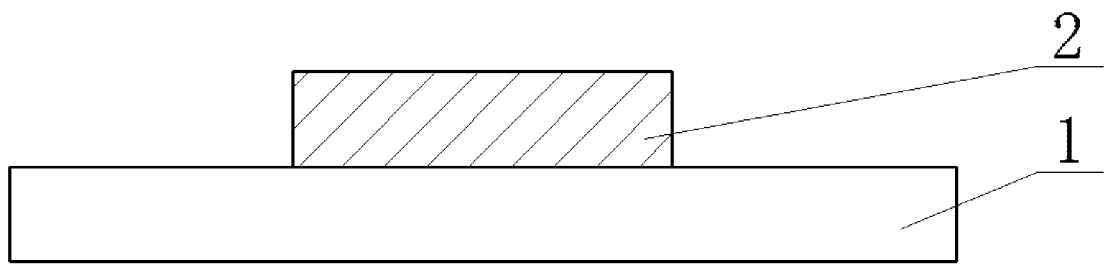
FIGS. 3a-6b illustrate structures implemented by steps of a method for manufacturing an organic transistor provided by an embodiment of the present disclosure.
Figure 3B:
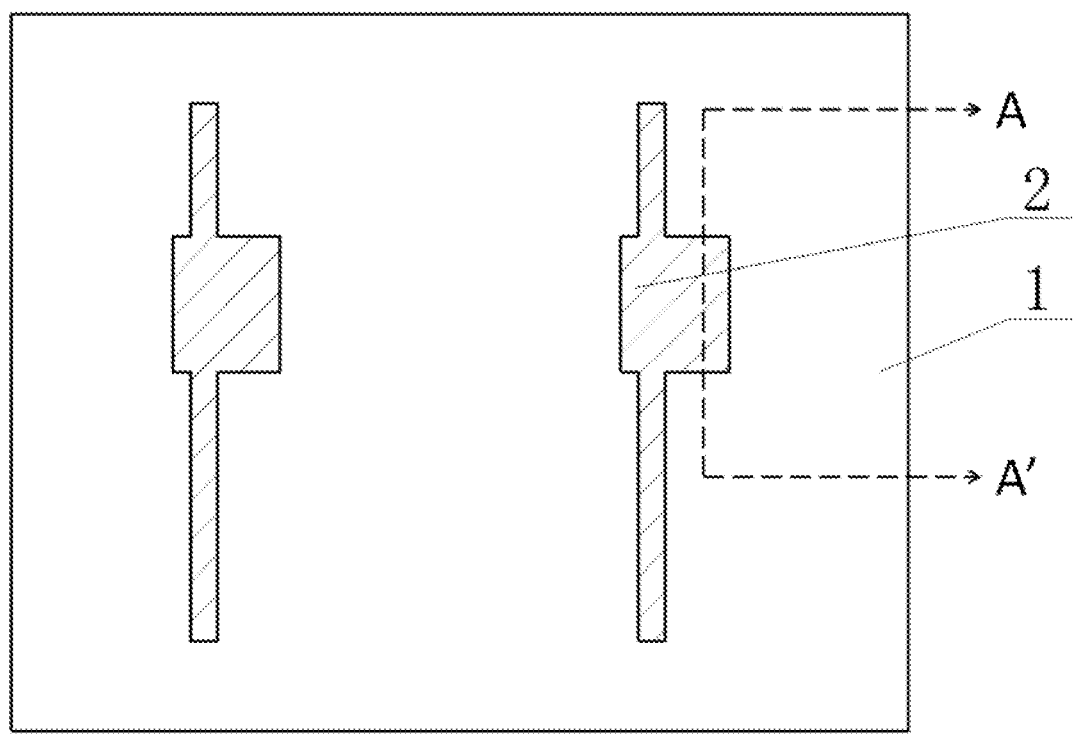

In some optional embodiments of the present disclosure, before the step of forming the organic polymer layer on the surface of the organic insulating layer, the method further includes: preparing a gate layer on the basal substrate and patterning the gate layer. As shown in FIGS. 3a and 3b, a gate layer is formed on the substrate 1 and the gate layer is patterned to obtain the gate electrode 2. FIG. 3b is a plan view of the structure realized in this step, and FIG. 3a shows a cross-sectional view of the structure in FIG. 3b taken along line A-A'. Optionally, the patterning process includes one or a combination of photolithography, nanoimprinting, and inkjet printing. Of course, the patterning process is not limited in the present disclosure.

Further, the gate layer is one or a combination of a magnetron sputtering metal material, an organic conductive material, and a metal nanometer material.

The organic insulating layer 3 is then formed on the patterned gate layer.

Optionally, in order to further improve the anti-interference characteristics of the above-mentioned transistor and the corresponding device for water and oxygen, the method for manufacturing the organic transistor of the present disclosure further includes: adding a water-oxygen barrier layer on both sides of the gate layer. In this way, it is possible to prevent external water and oxygen from causing damage to the gate and improve the stability of the entire device.

In some optional embodiments of the present disclosure, after step S11, the method further includes: step S12, annealing the organic insulating layer and the organic polymer layer. Through the annealing process, the organic insulating layer and the organic polymer layer can form stable chemical films respectively, thereby improving the corrosion resistance of the films to the subsequent process. It should be noted that the present disclosure does not limit the time and sequence of the annealing process. For example, the organic insulating layer and the organic polymer layer may be annealed together after the organic polymer layer is prepared. Alternatively, the organic insulating layer may be annealed first, and then the organic polymer layer is prepared and annealed.

Figure 4A:
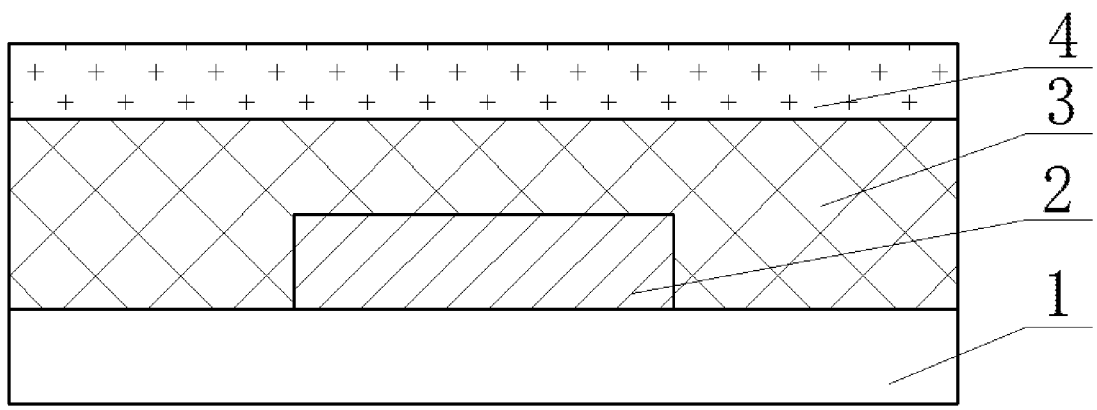
Figure 4B:
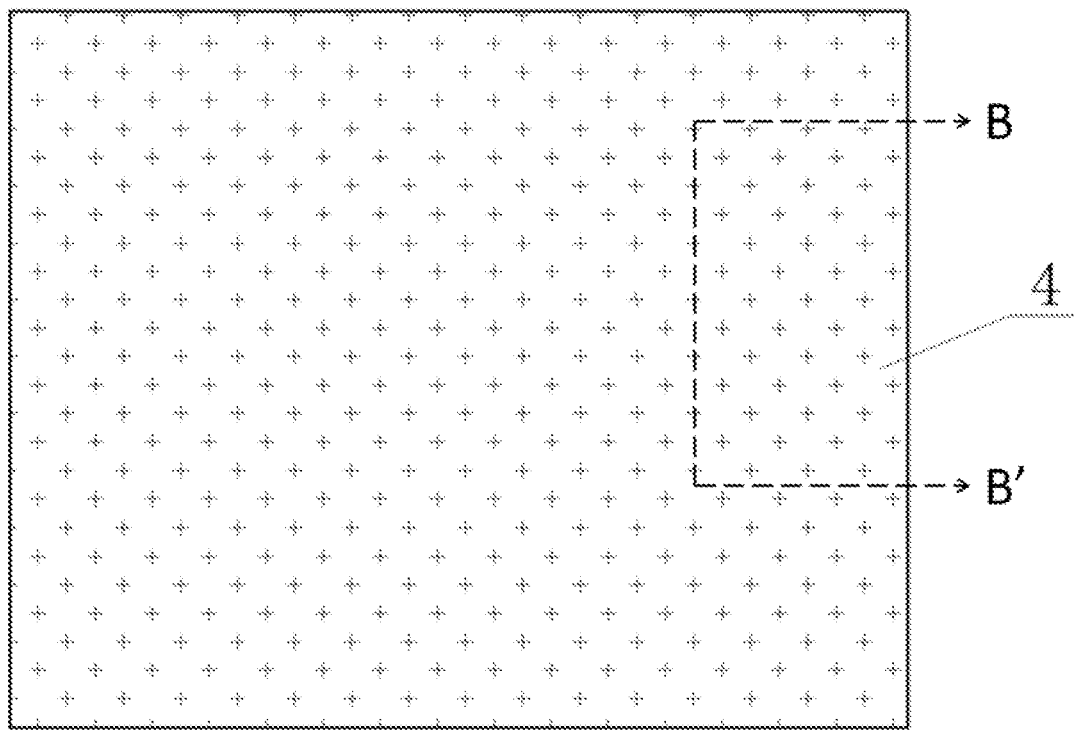

Step S13, performing a hydrophilic treatment and a hydrophobic treatment to a surface of the organic polymer layer in sequence. Optionally, the surface of the organic polymer layer is treated sequentially using plasma hydrophilic treatment and plasma hydrophobic treatment. As shown in FIGS. 4a and 4b, an organic insulating layer 3 and an organic polymer layer 4 are coated on the gate 2. FIG. 4b is a plan view of the structure realized in this step, and FIG. 4a shows a cross-sectional view of the structure in FIG. 4b taken along line B-B'. As can be seen from FIG. 4a, the organic polymer layer 4 is located above the organic insulating layer 3 and is a layer in contact with the photoresist. By performing a hydrophobic treatment to the surface of the organic polymer layer 4, the chemical modification effect for the surface of the organic polymer layer 4 can be enhanced, facilitating adhesion of the photoresist. In this way, the stability of the manufacturing process and the product quality are improved. It should be noted that in order to improve the adhesion effect of the photoresist, the hydrophobic treatment is required; however, it is difficult to obtain a desired effect by directly performing a hydrophobic treatment to the organic polymer layer. Therefore, the present disclosure proposes that the organic polymer layer is subjected to a hydrophilic treatment and then subjected to a hydrophobic treatment, thereby obtaining a surface suitable for adhesion of the photoresist.

Step S14, applying a photoresist (PR) on a side of the organic insulating layer (for example, on the organic polymer layer), and patterning the photoresist (for example, using a photolithography process) to form a confinement well.

Figure 5A:
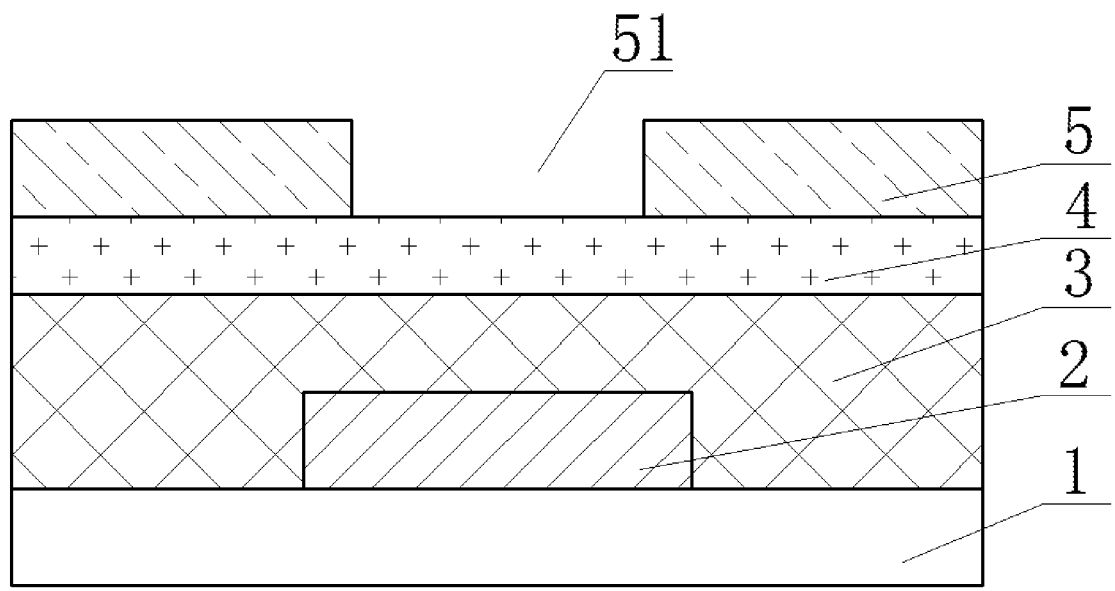
Figure 5B:
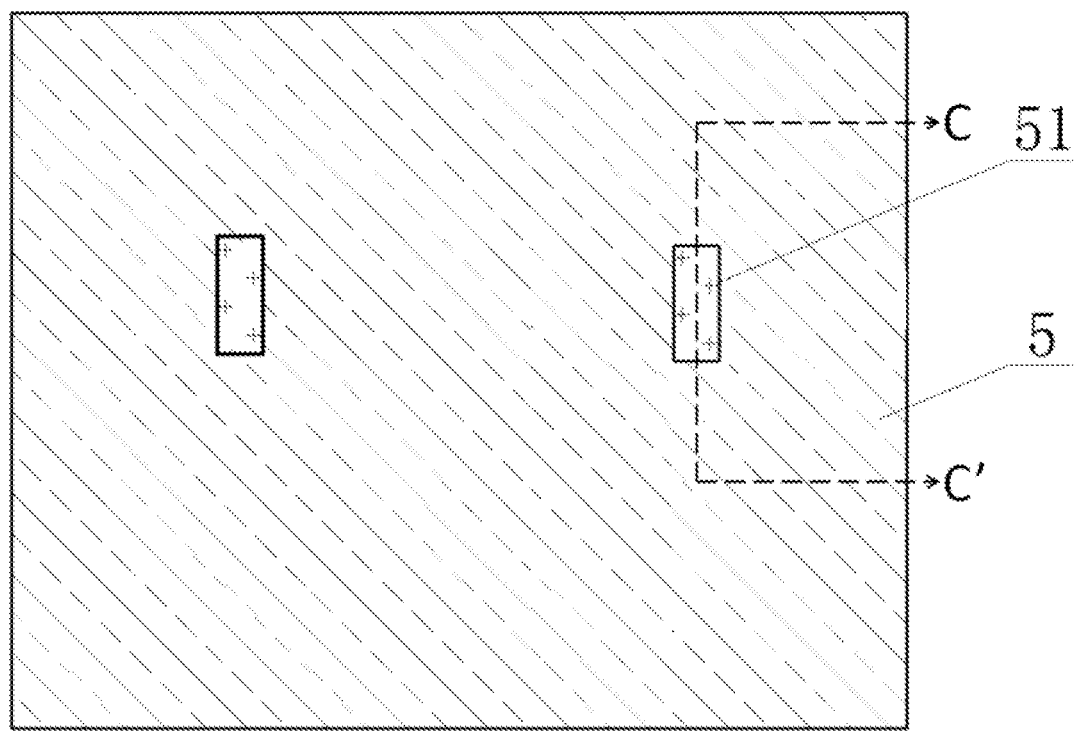

As shown in FIGS. 5a and 5b, a photoresist is coated on the organic polymer layer and a confinement well is formed. FIG. 5b is a plan view of the structure achieved in this step, and FIG. 5a shows a cross-sectional view of the structure in FIG. 5b taken along line C-C'. As can be seen from FIG. 5a, the confinement well 51 is formed on the photoresist 5 (that is, the trench structure with a predetermined shape is formed by using the organic polymer layer 4 and the photoresist 5). In this way, the organic single crystal subsequently obtained is limited to the confinement well 51 to form an organic single crystal layer with a predetermined structure, and can be directly used as an active layer.

Figure 6A:
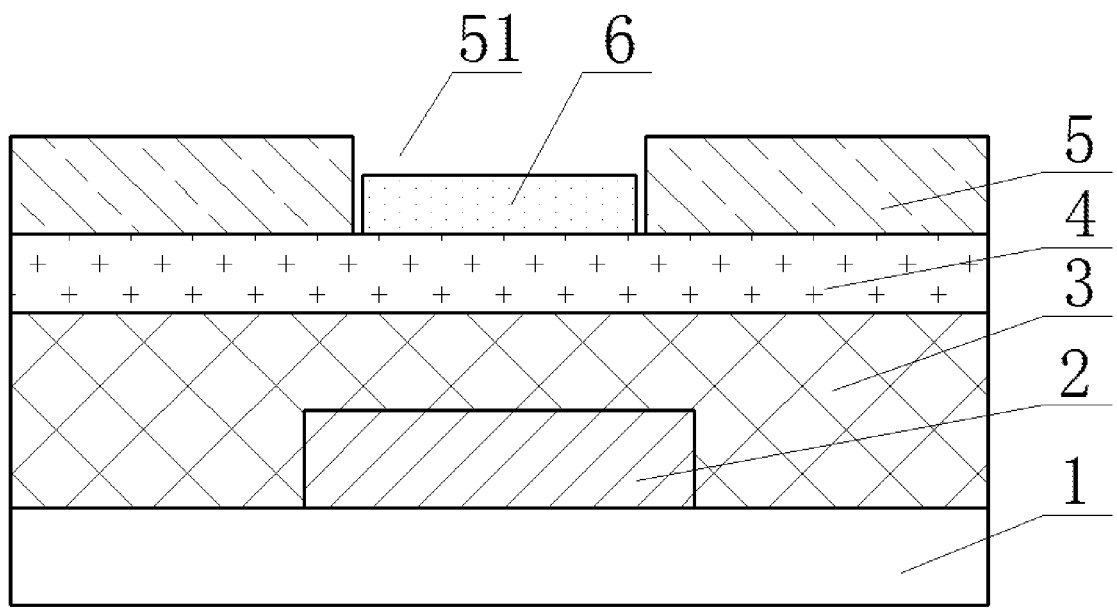
Figure 6B:
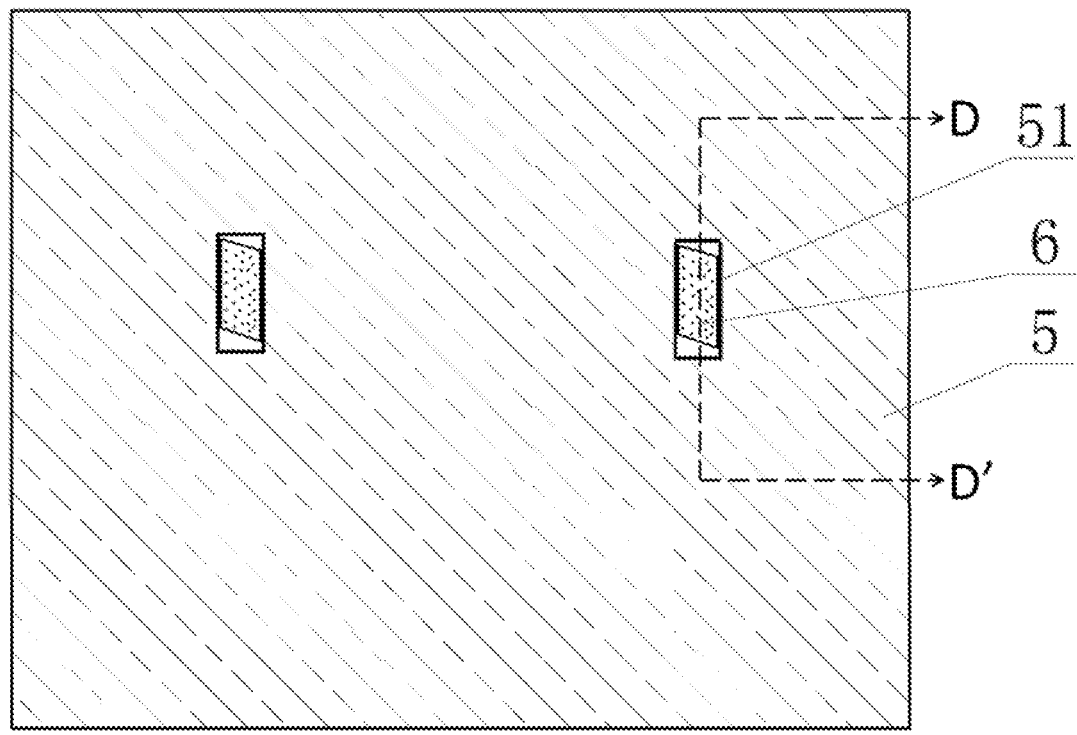

As shown in FIGS. 6a and 6b, an organic single crystal layer 6 is prepared in the confinement well 51. FIG. 6b is a plan view of the structure achieved in this step, and FIG. 6a shows a cross-sectional view of the structure in FIG. 6b taken along line D-D'. As can be seen from FIG. 6a, the organic single crystal formed by the solution of the organic semiconductor material is grown in the confinement well 51, and an organic single crystal with a predetermined shape can be obtained, that is, an organic single crystal layer 6 serving as an active layer is obtained.

Optionally, the solution of the organic semiconductor material is hydrophilic. After the step of patterning the photoresist to form the confinement well and before the step of adding the solution of the organic semiconductor material and the orthogonal solvent to the confinement well, the method further includes: step S15, performing a hydrophilic treatment to a surface of the organic polymer layer 4 not covered by the photoresist 5. This can remove organic matter that may remain during development, so that the exposed surface of the organic polymer layer forms a hydrophilic surface having a high hydroxyl density.

Step S16, determining whether to perform a hydrophobic treatment to the surface of the organic polymer layer based on the hydrophilicity or hydrophobicity of the semiconductor solution. Specifically, the following judgment principle can be utilized.

If the solution of the organic semiconductor material is hydrophilic, the surface of the organic polymer layer not covered by the photoresist is subjected to a hydrophilic treatment without hydrophobic treatment; if the solution of the organic semiconductor material is hydrophobic, the surface of the organic polymer layer not covered by the photoresist is subjected to a hydrophilic treatment and a hydrophobic treatment in sequence. In this way, the surface of the confinement well facilitates the adhesion of the subsequently added semiconductor solution, thereby improving the growth efficiency of the organic single crystal. After the above development process, the surface of the organic polymer layer adsorbs organic molecules in the developer, and forms a surface having uneven hydrophilicity/hydrophobicity in the cleaning process. Therefore, after the subsequent addition of the solution of the organic semiconductor material, due to the different surface adsorption forces everywhere, the overall uniformity will be affected. The present disclosure adds the hydrophobic and hydrophobic treatment process after the development step, which cooperate with the confinement well, improving the reliability and stability of the overall manufacturing process.

Step S17, adding a solution of an organic semiconductor material and an orthogonal solvent to the confinement well. Optionally, the solution of the organic semiconductor material and the orthogonal solvent are separately added to the confinement well by an inkjet printing process.

Step S18, volatilizing the orthogonal solvent by an annealing process to induce directional growth of single crystal of the organic semiconductor material in the confinement well, thereby obtaining an organic single crystal layer.

Alternatively, steps S17 and S18 may be repeated a plurality of times until an organic single crystal layer of a predetermined size is obtained.

That is, by performing a plurality of processes for preparing an organic single crystal, an organic single crystal layer having a desired thickness can be obtained.

Step S19, removing remaining photoresist and using the organic single crystal layer as an active layer. Thus, an organic transistor can be obtained, in which an organic single crystal layer is used as an active layer. The obtained organic transistor has high mobility and stability.

Figure 7A:
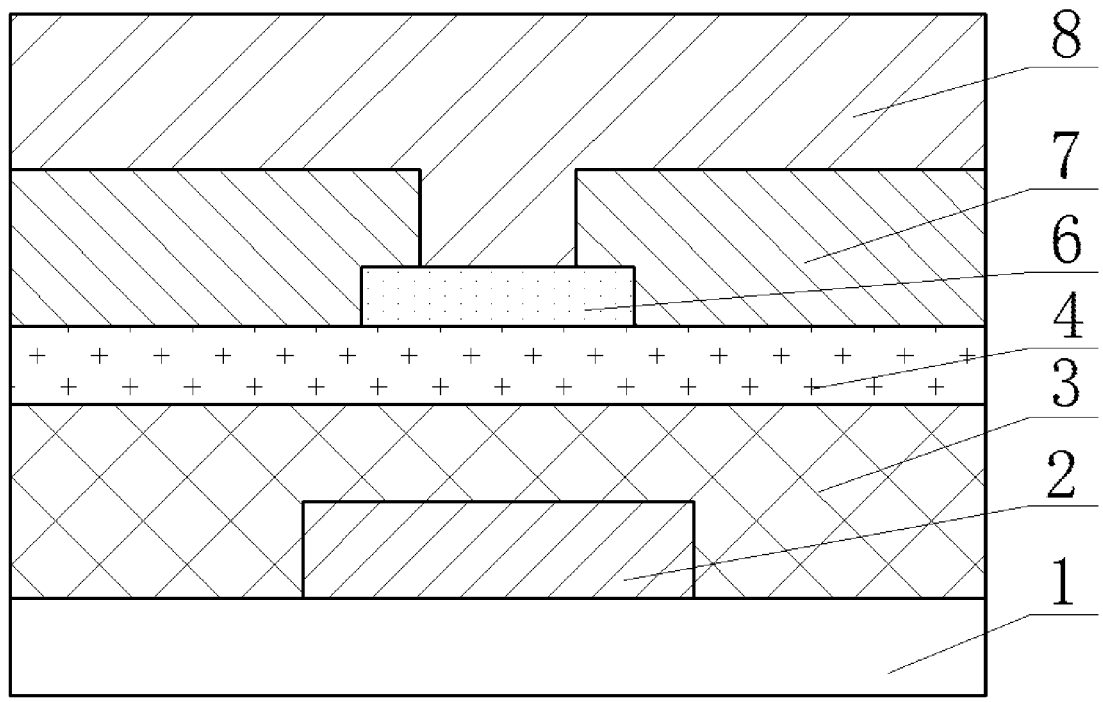
FIG. 7a shows a cross-sectional view of a packaged organic transistor provided by an embodiment of the present disclosure.
Figure 7B:
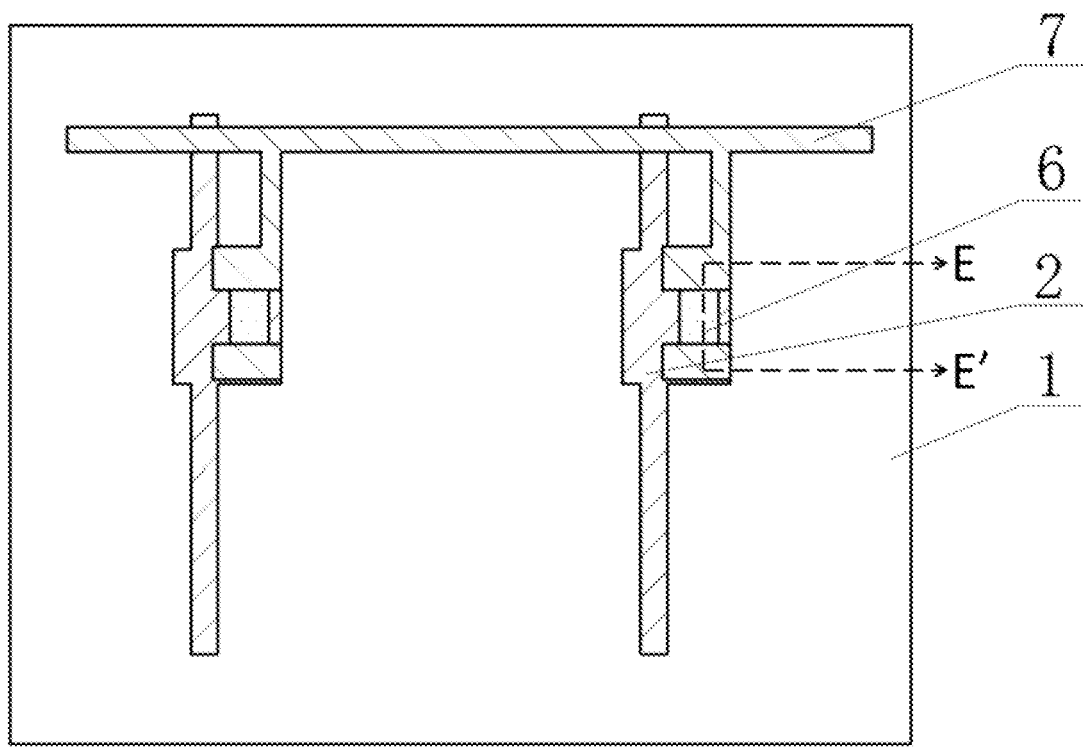
FIG. 7b is a structural schematic diagram of a packaged organic transistor according to an embodiment of the present disclosure.

In addition, it can be understood that the above-mentioned manufacturing method for the organic transistor may further include step S20, preparing a source/drain electrode layer and packaging the organic transistor. As shown in FIGS. 7a and 7b, the source/drain electrode layer 7 is prepared and packaged. FIG. 7b is a structural schematic view of a packaged organic transistor according to an embodiment of the present disclosure, and FIG. 7a is a cross-sectional view of the structure in FIG. 7b taken along line E-E'. The source/drain electrode layer 7 is in partial contact with the organic single crystal layer 6 and forms a certain shape over the organic single crystal layer 6. The package is realized by the encapsulation layer 8. In this way, the directionally grown organic single crystal can be prepared with the orthogonal solvent in the preparation process of the organic transistor, and be used as an active layer. The performance of the organic transistor is thus greatly improved.

As can be seen from the above description, in the method for manufacturing the organic transistor provided by the present disclosure, an organic single crystal layer is directionally grown in a pre-formed confinement well by using an orthogonal solvent and a solution of an organic semiconductor material, thereby providing a method for manufacturing an organic single crystal layer with high efficiency and stability. By constructing the confinement well in the photoresist, the above-described organic single crystal can be directionally grown in the confinement well, thereby preparing an accurate organic single crystal layer for serving as an active layer. Due to the high mobility and stability of the single crystal, the prepared organic transistor has better display quality. Therefore, in the embodiments of the organic transistor, the array substrate, the display device, and the related preparation method of the present disclosure, an efficient and reliable method for preparing an organic single crystal layer is provided. The embodiment of the present disclosure also produces an organic single crystal in a flexible display device at a low temperature, and the organic single crystal can be used as an active layer, resulting in an organic transistor having high mobility and stability. In addition, since the above process utilizes the hydrophilicity/hydrophobicity of the solution and repeat the treatment on the interface, the difficulty for realizing the orthogonal solution process can be reduced.

Further, since the entire manufacturing process described above can be performed in an environment of not higher than 150 degrees Celsius, the present disclosure can be applied to an organic substrate. Therefore, the organic single crystal semiconductor having high mobility can be used as a process basis, and there is a huge potential application value in the flexible display field.

In some alternative embodiments of the present disclosure, an organic transistor is provided. Referring to FIG. 6a, the organic transistor includes an organic insulating layer 3 and an organic single crystal layer 6 disposed on the organic insulating layer 3. The organic single crystal layer 6 serves as an active layer. Optionally, the organic single crystal layer can be obtained by the method for manufacturing the organic single crystal layer described in any of the above embodiments. Thus, by using the organic single crystal layer 6 as an active layer, the organic transistor has high mobility and stability.

Optionally, the organic transistor further includes an organic polymer layer 4 disposed between the organic single crystal layer 6 and the organic insulating layer 3. In this way, in the process of preparing the organic single crystal layer 6 by the orthogonal solvent, the organic polymer layer 4 can protect the organic insulating layer 3 from being damaged by the orthogonal solvent, thereby improving the stability and reliability of the manufacturing process.

In some optional embodiments of the present disclosure, the material of the organic polymer layer is a polysiloxane-based organic polymer. Optionally, the material of the organic polymer layer is polymethylsilsesquioxane.

In some optional embodiments of the present disclosure, the material of the organic insulating layer includes one or more of polyacrylonitrile, polypropylene oxide, and polymethyl methacrylate.

An embodiment of the present disclosure also provides an array substrate. The array substrate includes the organic transistor described in the above embodiments.

An embodiment of the present disclosure also provides a display device. The display device includes the array substrate described in the above embodiment.

Since each of the organic transistor, the array substrate, and the display device includes the organic transistor obtained by the above-described method, the same technical effect is obtained, which is not repeatedly described herein.

As can be seen from the above description, in the organic transistor, the array substrate, the display device and the related preparation method provided by the present disclosure, an organic single crystal layer is directionally grown in a pre-formed confinement well by using an orthogonal solvent and a solution of an organic semiconductor material, thereby providing a method for manufacturing an organic single crystal layer with high efficiency and stability. By constructing the confinement well in the photoresist, the above-described organic single crystal can be directionally grown in the confinement well, thereby preparing an accurate organic single crystal layer for serving as an active layer. Due to the high mobility and stability of the single crystal, the prepared organic transistor has better display quality. Therefore, in the embodiments of the organic transistor, the array substrate, the display device, and the related preparation method of the present disclosure, an efficient and reliable method for preparing an organic single crystal layer is provided. The embodiment of the present disclosure also produces an organic single crystal in a flexible display device at a low temperature, and the organic single crystal can be used as an active layer, resulting in an organic transistor having high mobility and stability.

It should be understood by those of ordinary skill in the art that the discussion of any of the above embodiments is only exemplary, and is not intended to suggest that the scope of the disclosure (including the claims) is limited to these examples. Based on the concepts of the present disclosure, the embodiments and the technical features in the embodiments can be combined, the steps can be carried out in other order, and there are many variations of the various aspects of the present disclosure as described above, which are not provided in detail for the sake of brevity.

All such alternatives, modifications, and variations are intended to be included within the scope of the appended claims. Therefore, any omissions, modifications, equivalents, improvements, etc., which are made within the spirit and scope of the present disclosure are intended to be included within the scope of the present disclosure.

What is claimed is:

1. A method for manufacturing an organic transistor, comprising:
    applying a photoresist on a side of an organic insulating layer;
    patterning the photoresist to form a confinement well;
    adding a solution of an organic semiconductor material and an orthogonal solvent to the confinement well;
    volatilizing the orthogonal solvent by an annealing process to induce directional growth of single crystal of the organic semiconductor material in the confinement well to form an organic single crystal layer;
    removing remaining photoresist; and
    using the organic single crystal layer as an active layer of the organic transistor,
    wherein before applying the photoresist on the side of the organic insulating layer, the method further comprises, forming an organic polymer layer on a surface of the organic insulating layer, and
    wherein forming the organic polymer layer on the surface of the organic insulating layer comprises: performing a hydrophilic treatment and a hydrophobic treatment to a surface of the organic polymer layer in sequence.

2. The method according to claim 1, wherein after patterning the photoresist to form the confinement well and before adding the solution of the organic semiconductor material and the orthogonal solvent to the confinement well, the method further comprises:
    performing a hydrophilic treatment to a surface of the organic polymer layer not covered by the photoresist; the solution of the organic semiconductor material being hydrophilic.

3. The method according to claim 1, wherein forming the organic polymer layer on the surface of the organic insulating layer comprises:
    preparing the organic polymer layer on the surface of the organic insulating layer using a polysiloxane-based organic polymer.

4. The method according to claim 1, wherein the organic insulating layer is prepared using one or more of polyacrylonitrile, polypropylene oxide, and polymethyl methacrylate.

5. The method according to claim 2, wherein the organic insulating layer is prepared using one or more of polyacrylonitrile, polypropylene oxide, and polymethyl methacrylate.

6. The method according to claim 3, wherein the organic insulating layer is prepared using one or more of polyacrylonitrile, polypropylene oxide, and polymethyl methacrylate.

7. A method for manufacturing an organic transistor, comprising:
    applying a photoresist on a side of an organic insulating layer;
    patterning the photoresist to form a confinement well;
    adding a solution of an organic semiconductor material and an orthogonal solvent to the confinement well;
    volatilizing the orthogonal solvent by an annealing process to induce directional growth of single crystal of the organic semiconductor material in the confinement well to form an organic single crystal layer;
    removing remaining photoresist; and
    using the organic single crystal layer as an active layer of the organic transistor,
    wherein before applying the photoresist on the side of the organic insulating layer, the method further comprises: forming an organic polymer layer on a surface of the organic insulating layer, and
    wherein after patterning the photoresist to form the confinement well and before adding the solution of the organic semiconductor material and the orthogonal solvent to the confinement well, the method further comprises: performing a hydrophilic treatment and a hydrophobic treatment to a surface of the organic polymer layer not covered by the photoresist in sequence; the solution of the organic semiconductor material being hydrophobic.

8. The method according to claim 7, wherein after patterning the photoresist to form the confinement well and before adding the solution of the organic semiconductor material and the orthogonal solvent to the confinement well, the method further comprises:
    performing a hydrophilic treatment to a surface of the organic polymer layer not covered by the photoresist; the solution of the organic semiconductor material being hydrophilic.

9. The method according to claim 7, wherein forming the organic polymer layer on the surface of the organic insulating layer comprises:
    preparing the organic polymer layer on the surface of the organic insulating layer using a polysiloxane-based organic polymer.

10. The method according to claim 7, wherein the organic insulating layer is prepared using one or more of polyacrylonitrile, polypropylene oxide, and polymethyl methacrylate.

* * * * *